United States Patent [19]

Itoh et al.

[11] Patent Number: 4,729,941

[45] Date of Patent: Mar. 8, 1988

[54] PHOTORESIST PROCESSING SOLUTION WITH QUATERNARY AMMONIUM HYDROXIDE

[75] Inventors: Kunio Itoh, Tokyo; Kimio Watabe, Mie; Masahiro Shiozaki, Kanagawa, all of Japan

[73] Assignees: Hoechst Japan Kabushiki Kaisha; Nisso Petrochemical Industries Co., Ltd., both of Tokyo, Japan

[21] Appl. No.: 785,518

[22] Filed: Oct. 8, 1985

[30] Foreign Application Priority Data

Oct. 9, 1984 [JP] Japan ................. 59-211742
Feb. 12, 1985 [JP] Japan ................. 60-24975
Feb. 12, 1985 [JP] Japan ................. 60-24976
Jun. 20, 1985 [JP] Japan ................. 60-135030

[51] Int. Cl.$^4$ .................. G03C 5/00; G03C 5/24; G03C 5/34
[52] U.S. Cl. .................. 430/331; 430/326; 252/528; 252/529; 252/547; 252/548
[58] Field of Search .............. 430/331; 252/547, 548, 252/528, 529

[56] References Cited

U.S. PATENT DOCUMENTS

| | | | |
|---|---|---|---|
| 2,185,163 | 12/1939 | Ulrich | 260/457 |
| 3,586,504 | 6/1971 | Coates et al. | 430/331 |
| 4,239,661 | 12/1980 | Muraoka et al. | 252/541 |
| 4,339,340 | 7/1982 | Muraoka et al. | 252/79.5 |
| 4,411,735 | 10/1983 | Belani | 430/317 |
| 4,411,981 | 10/1983 | Minezaki | 430/299 |
| 4,464,461 | 8/1984 | Guild | 430/331 |
| 4,576,903 | 3/1986 | Baron et al. | 430/331 |

FOREIGN PATENT DOCUMENTS

| | | | |
|---|---|---|---|
| 0062733 | 1/1982 | European Pat. Off. | 430/331 |
| 0097282 | 6/1983 | European Pat. Off. | 430/331 |
| 819000 | 10/1937 | France . | |
| 1060256 | 3/1967 | United Kingdom . | |
| 1147647 | 4/1969 | United Kingdom . | |

OTHER PUBLICATIONS

Van Nostrand's Scientific Encyclopedia, Sixth Edition, pp. 887–888.
M. Asano, T. Cho and H. Muraoka; "Application of Choline in Semiconductor Technology"; Oct. 17–22, 1976, p. 911.

*Primary Examiner*—Charles L. Bowers, Jr.
*Attorney, Agent, or Firm*—Schwartz, Jeffery, Schwaab, Mack, Blumenthal & Evans

[57] ABSTRACT

A photoresist processing solution includes a 2-hydroxyethyl-(mono-or polyoxyethyl) trialkyl ammonium hydroxide and is used in a process for development of photoresists having a solubility in aqueous alkaline solution which is a function of exposure to light.

4 Claims, No Drawings

PHOTORESIST PROCESSING SOLUTION WITH QUATERNARY AMMONIUM HYDROXIDE

BACKGROUND OF THE INVENTION

The present invention relates to a photoresist processing solution. More particularly, the invention relates to a photoresist processing solution useful in the development of photoresist compositions that have different solubilities in aqueous alkaline solutions upon exposure to light, and/or in the removal of selected areas of such alkali-soluble photoresist compositions.

Resin films that are decomposed or hardened by the action of external energy such as light are used as photoresists. Conventional etchants or removing agents for use in photo-decomposed or hardened areas of a photoresist are organic, strongly alkaline compounds such as tetramethyl ammonium hydroxide and trimethylhydroxyethyl ammonium hydroxide (also known as "choline") (in this connection, see, for example, Japanese Patent Application No. 35424/81).

In forming micropatterns on LSI (Large Scale Integration) devices, photoresist layers that have different solubilities in alkali solutions upon exposure to light are exclusively used. The principal resin component of such photoresist compositions is a novolak resin and/or a hydroxystyrene polymer, which is mixed with a quinonediazide or bisazide compound. Conventional metal-containing inorganic alkali solutions used as photoresist etchants or removers have the disadvantage of contaminating the wafers by migration of metal ions into LSI devices, and in order to avoid this problem, the use of highly concentrated aqueous solutions of tetramethyl ammonium hydroxide or choline is recommended.

However, solutions containing tetramethyl ammonium hydroxide or choline are usually so violent in action (the extent of action of course depending on the concentrations of such compounds) that they have a tendency to dissolve not only the intended areas of a resin film but also other areas which should not be attacked. On the other hand, if such solutions are diluted to an extent that no phenomenon other than the removal of a photoresist will take place in the removal step, the time necessary for photoresist removal is so prolonged that the process efficiency is reduced.

SUMMARY OF THE INVENTION

It is accordingly an object of the invention to provide a photoresist processing solution which does not contaminate photoresist wafers.

It is another object of the invention to provide a photoresist solution which dissolves only those areas of a photoresist which are intended to be dissolved.

These objects are achieved by a photoresist processing solution, comprising:

(a) a quaternary ammonium hydroxide of the formula I

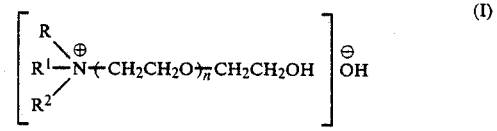

wherein

R, $R^1$ and $R^2$ are the same or different and are selected from the group consisting of an alkyl group having 1 to 5 carbon atoms; and n is a positive number of 1 to 10; and (b) a solvent selected from the group consisting of water, a water-miscible organic solvent, and mixtures thereof.

The objects of the invention are also achieved by a process for preparing a photoresist stencil which comprises the imagewise irradiation of a photoresist layer with actinic radiation to form a photoresist image within the layer, followed by the removal of the non-image portion of the layer through treatment with the above solution.

The objects of the invention are still further achieved by a process for removing a photoresist stencil by treatment of a photoresist layer with the above solution.

DETAILED DESCRIPTION OF THE PREFERRED EMBODIMENTS

As a result of many years of research and development efforts to solve the problems described above, the present inventors have unexpectedly found that all the defects of the conventional tetramethyl ammonium hydroxide and choline can be eliminated by using a specific quaternary ammonium compound. The present invention has been accomplished on the basis of this finding.

The present invention thus provides for a photoresist processing solution that contains a trimethyl-(2-hydroxyethyoxy-ethyl) ammonium hydroxide of formula I:

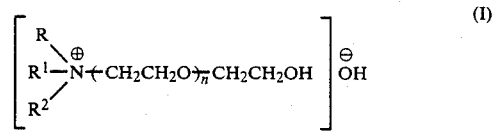

wherein

R, $R^1$ and $R^2$ are the same or different and are each an alkyl group having 1 to 5 carbon atoms;

n represents the average number of recurring units and is a positive number of 1 to 10;

and water and/or a water-miscible organic solvent.

The compound of formula I is believed to be a novel compound.

The production of the compound of formula I is not limited to any particular process. When n in formula I is 1, a trialkylamine is reacted with 2-(2-chloroethoxy)ethanol, or N,N-dialkylaminoethoxyethanol is reacted with an alkyl halide, in a suitable solvent to form a trialkyl-2-hydroxyethoxyethyl ammonium halide, and the halide ion in the resulting product is exchanged for a hydroxide ion by a conventional method so as to produce a compound of formula I. In order to produce a mixture of compounds of formula I wherein n is 1–10, one equivalent of trialkylamine and at least one equivalent of water, in a suitable solvent, may be reacted with at least two equivalents of ethylene oxide.

In formula I, R, $R^1$ and $R^2$ may be the same or different and each represent $C_1$–$C_5$ alkyl groups, preferably $C_1$–$C_3$ alkyl groups, such as methyl, ethyl, propyl or isopropyl. Most preferably, R, $R^1$ and $R^2$ are the same and each represents a methyl group. If the number of carbon atoms in each alkyl group exceeds 5, the weight proportion of the alkyl groups in the compound of formula I is increased, causing an increase in the molecular weight of that compound. As a result, given a solution having the same concentration of the compound, the alkali equivalent of the solution becomes undesirably low.

In formula I, n represents the average number of recurring units and is a positive number of 1-10. If n is less than 1 or more than 10, the compound of formula I is not advantageous for use as a component of the photoresist processing solution of the present invention.

As already indicated above, the compound of formula I may be present either as an individual compound or as a mixture. Therefore, the photoresist processing solution of the present invention may contain one or more of the compounds of formula I.

The water-miscible organic solvent used in the photoresist processing solution of the present invention is selected from the group consisting of $C_1$-$C_4$ aliphatic alcohols, acetone, methyl ethyl ketone, N-methylpyrrolidone, dimethyl sulfoxide, N,N-dimethylformamide and N,N-dimethylacetamide. The preferred organic solvents are $C_1$-$C_4$ aliphatic alcohols, acetone and N-methylpyrrolidone. Illustrative $C_1$-$C_4$ aliphatic alcohols are methanol, ethanol, isopropyl alcohol and sec.-butanol. The compounds of formula I will remain stable in water and/or the water-miscible organic solvent.

If water and/or a $C_1$-$C_4$ aliphatic alcohol is used as a reaction solvent for the production of the compound of formula I, the photoresist processing solution of the present invention will be formed simultaneously with the completion of the reaction. Alternatively, the compound of formula I is first prepared using a reaction solvent (e.g., $C_1$-$C_4$ alcohol) other than the intended solvent, and after the preparation of the compound, the reaction solvent is distilled off while a suitable solvent (e.g., acetone) is gradually added to the compound. Water or water-miscible organic solvents may be used singly as the solvent of the processing solution. Two or more water-miscible organic solvents may be used as a solvent mixture. The ratio of mixing water-miscible organic solvents with either one another or water may be selected at a desired value.

When the photoresist processing solution of the present invention is used as a remover, acetone or N-methylpyrrolidone is preferred as the organic solvent. It is particularly preferred that acetone or N-methylpyrrolidone is used as a mixture with water. However, a photoresist processing solution containing the compound of formula I and a mixture of water and acetone or N-methylpyrrolidone may also be used satisfactorily as a developer for both positive- and negative-acting photoresists.

The concentration of the compound of formula I in the photoresist processing solution of the present invention is not critical for the purposes of the invention. The concentration generally ranges from about 0.01 to about 50 wt%, preferably from about 0.05 to about 30 wt%, of the processing solution. However, this range may be freely varied depending upon the object of the use of the processing solution (e.g., as developer or remover), the device to be processed by the solution (e.g., SMI, LSI or VLSI circuit) and/or the conditions for the processing of the photoresist (e.g., temperature and time). Therefore, the exact concentration of the photoresist processing solution of the present invention used in actual applications may be readily determined by the one skilled in the art in consideration of all the factors illustrated above.

PREPARATIONS AND EXAMPLES

The following preparations and examples are provided for further illustration of the invention. All "parts" hereunder are by weight unless otherwise indicated.

PREPARATION 1

Preparation of Trimethyl-(2-hydroxyethyoxyethyl) Ammonium Hydroxide

An autoclave (capacity: 500 ml) was charged with 200 parts of methanol and 72.8 parts of trimethylamine. After heating the mixture to 100° C., 125 parts of 2-(2-chloroethoxy)ethanol were added over a period of 1 hour and the resulting mixture was heated at 100° C. for an additional 4 hours under agitation. After completion of the reaction, methanol was distilled off from the reaction mixture under vacuum. Three hundred parts of acetone were added to the residue so as to crystallize trimethyl-(2-hydroxyethyoxyethyl) ammonium chloride, and 176 parts of this product were isolated by a conventional method (yield: 96%).

Eighty parts of the trimethyl-(2-hydroxyethyoxyethyl) ammonium chloride prepared by the procedures described above were dissolved in pure water to make a total volume of 1,000 parts. The resulting solution was passed at a velocity of SV=2 through a column packed with 700 ml of a previously regenerated anion exchange resin (OH type of Dia-Ion SA-10A of Mitsubishi Chemical Industries Limited) to provide a total exchange capacity of 0.91 equivalents. An aqueous solution containing 6.0 wt% of trimethyl-(2-hydroxyethyoxy-ethyl) ammonium hydroxide was obtained in an amount of 1,170 parts.

Identification of Trimethyl-(2-hydroxyethoxy-ethyl) Ammonium Hydroxide

An aqueous solution of sodium tetraphenylboranate was added to the effluent from the ion exchange column, whereupon a precipitate formed.

This precipitate is believed to have occurred in accordance with the following reaction scheme (A), and this suggests the presence of the ammonium hydroxide in the previously obtained aqueous solution.

Reaction Scheme A

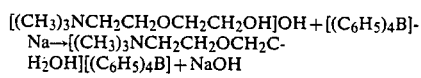

Tungstophosphoric acid was added to another portion of the effluent from the ion exchange column and the resulting precipitate was dried for quantitative determination. The above reaction may be expressed by the following scheme (B). Analysis showed that the trimethyl-(2-hydroxyethyoxy-ethyl) ammonium hydroxide had a molecular weight of 167.2.

Reaction Scheme B

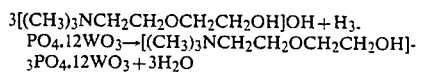

PREPARATION 2

An autoclave (capacity: 500 ml) was charged with 200 parts of methanol and 94.5 parts of triethylamine. After heating the mixture to 130° C., 135 parts of 2-[2-

(2-chloro-ethoxy)ethoxy]ethanol was added over a period of 1 hour and the resulting mixture was heated at 130° C. for an additional 4 hours. Crystallization was performed as in Preparation 1 to obtain 205.0 parts of triethyl 2-[2-(2-hydroxy-ethoxy)ethoxy]ethylammonium chloride (yield: 95%).

A portion (94.5 parts) of this ammonium chloride was dissolved in pure water to make a total volume of 1,000 parts. The resulting solution was passed at a velocity of SV=2 through a column packed with an ion exchange resin which was the same as that used in Preparation 1. A solution containing 6.1 wt% of triethyl 2[2-(2-hydroxy-ethoxy)ethoxy]ethyl ammonium hydroxide was obtained in an amount of 1,440 parts.

The production and presence of the desired ammonium hydroxide were confirmed by analysis of the so obtained solution in accordance with the method described in Preparation 1.

PREPARATIONS 3-6

An autoclave (capacity: 500 ml) was charged with water and trimethylamine in the amounts indicated in Table 1 below, and ethylene oxide was added to the mixture over a period of 2 hours at one of the temperatures also indicated in Table 1. The resulting mixture was stirred for one additional hour at the same temperature. Thereafter, the pressure in the autoclave was reduced to one atmosphere and the concentration of the mixture was reduced to about 15 wt% by addition of water so as to avoid any coloration of the mixture. The results are shown in Table 1.

Each of the aqueous solutions thus obtained was analyzed by the method shown in Preparation 1 to confirm the production and presence of the corresponding quaternary ammonium hydroxide.

scribed in Preparation 1 so as to confirm the production and presence of the hydroxide in the solution.

EXAMPLE 1

(A) Silicon wafers (4 in$^\phi$) cut in the <100> direction were lightly etched with an aqueous solution of $H_2O_2$ and $H_2SO_4$ and washed thoroughly with deionized water. After confirming that the electroconductivity of deionized water on the wafers dropped to an adequately low level, they were dehydrated by baking at 200° C. for 1 hour or longer. Then, the wafers were treated with a hexamethyl disilazane (HMDS) and cooled to prepare samples of clean wafer for use in the subsequent experiments.

(B) The clean Si wafers prepared in step (A) were spin-coated with a solution of
6 p.b.w. of the 1,2-naphthoquinone-2-diazide-5-sulfonic acid ester of 2,3,4-trihydroxybenzophenone and
21 p.b.w. of novolak resin in
60 p.b.w. of 2-ethoxy-ethyl acetate,
7 p.b.w. of xylol and
7 p.b.w. of butyl acetate
using a spin coater of Dai-Nippon Screen Mfg. Co., Ltd. The coated wafers were pre-baked at 90° C. for 5 minutes on a belt-type hot plate of Dai-Nippon Screen Co., Ltd. The pre-baked photoresist layer on each wafer was about 2 μm thick. The wafers were then patterned by exposure with a proximity contact printer of Canon Inc. The source of exposure was ultraviolet light of a broad range from an ultrahigh pressure mercury lamp which was equipped with an ND 50 filter for the purpose of controlling the intensity of uv radiation. The intensity of uv radiation was 7.6 mW/cm$^2$ at a wavelength of 400 nm.

(C) The photoresist layer on three of the patterned

TABLE 1

| | Reaction Conditions | | | | Results | | | |
|---|---|---|---|---|---|---|---|---|
| Preparation | Water (parts) | Trimethyl-amine (parts) | Ethylene oxide (parts) | Temp. (°C.) | Weight of Reaction Mixture (parts) | Weight of Diluted Reaction Mixture (parts) | Alkali conc. (meq/g) | Average MW |
| 3 | 326 | 29.5 | 110 | 10 | 456 | 913 | 0.536 | 167 (1.0)* |
| 4 | 170 | 34.0 | 127 | 30 | 325 | 1000 | 0.564 | 217 (2.2) |
| 5 | 170 | 34.0 | 127 | 10 | 324 | 1002 | 0.562 | 242 (2.7) |
| 6 | 400 | 21.0 | 154 | 30 | 580 | 1100 | 0.210 | 183 (1.2) |

*The figures in parentheses represent n in Formula (I)

PREPARATION 7

Eighty parts of the trimethyl-(2-hydroxyethyoxy-ethyl) ammonium chloride prepared by the method described in Preparation 1 were dissolved in 150 parts of ethanol. To the solution, a 5 wt% solution of KOH in ethanol was added in an amount equivalent to that of the ammonium chloride, and the resulting precipitate was filtered off. The precipitate was found to consist of potassium chloride and its weight was 31.9 parts. It was therefore assumed that 98% of the chloride was converted to trimethyl-(2-hydroxyethyoxy-ethyl) ammonium hydroxide. About 2,000 parts of water were added to the hydroxide solution, and as much ethanol as possible was distilled off at a reduced pressure of about 30 mmHg. The residue was analyzed by the method dewafers was treated with the processing solutions made in Preparations 1, 3 and 4. The photoresist layer on the other wafer was treated with a commercial choline developer. Development was performed by the dip method using a developing bath agitated at a temperature close to the ambient temperature of a clean room. The results are shown in Table 2.

The values shown in the "Exposure Energy" in Table 2 were measured by the following method: a single wafer was patterned with different amounts of exposure, and after development for a given time, the thickness of the photoresist layer in the exposed areas was measured with an optical (n=1.64) thickness gauge, and the amount of exposure necessary to produce a residual film of zero percent in the exposed areas was read.

TABLE 2
EFFECTS OF THE PROCESSING SOLUTIONS OF THE PRESENT INVENTION USED AS PHOTORESIST DEVELOPING SOLUTIONS

| Run No. | Compound | Solvent | Normality (N) | Developing Time (min.) | Exposure Energy (mJ/cm$^2$) |
| --- | --- | --- | --- | --- | --- |
| 1 | Preparation 1 | Water | 0.2033 | 1.00 | 38.00 |
| 2 | Preparation 3 | Water | 0.1650 | 1.00 | 34.96 |
| 3 | Preparation 4 | Water | 0.1715 | 0.83 | 30.40 |
| 4 (Comparative Ex.) | Choline | Water | 0.3907 | 1.00 | 42.56 |

As the above data show, the processing solutions of the present invention containing the compounds made in Preparations 1, 3 and 4 required lower exposure energies than the comparative sample for a given duration of development. In addition, the concentrations of the compounds that had to be incorporated in the developer solutions were about half the amount of the conventional choline.

Therefore, the processing solution of the present invention will provide for an easier treatment of waste effluents than the conventionally used choline.

EXAMPLE 2

The photoresist pattern on Si wafers exposed and developed as in Example 1 was post-baked on a belt-type hot plate of Dai-Nippon Screen Co., Ltd. at 120° C. for 10 minutes. Thereafter, the wafers were dipped in various processing solutions under agitation at room temperature. The results of photoresist removal are shown in Table 3.

TABLE 3
EFFECTS OF THE PROCESSING SOLUTIONS OF THE PRESENT INVENTION USED AS PHOTORESIST REMOVING SOLUTIONS

| Run No. | Compound | Solvent | Normality (N) | Treating Time (sec.) | Removal |
| --- | --- | --- | --- | --- | --- |
| 1 | Preparation 1 | Water | 0.32 | ≦40 | Good |
| 2 | Preparation 3 | Water | 0.51 | ≦20 | Excellent |
| 3 | Preparation 3 | Water | 0.25 | ≦40 | Good |
| 4 | Preparation 3 | EtOH | 0.25 | ≦40 | Good |
| 5 | Preparation 3 | Water/Acetone (1:1) | 0.17 | ≦40 | Good |
| 6 | Preparation 3 | Water/N—Methyl-pyrrolidone (1:2) | 0.20 | ≦40 | Good |
| 7 (Comparative Ex.) | Choline | Water | 0.39 | ≧600 | Not removed |

As the data in Table 3 show, the processing solutions also exhibit an excellent ability to remove a photoresist layer even at lower concentrations than the conventional solution using choline. If choline is used at the same concentration as those of the compounds prepared in accordance with the present invention, the period of treatment must of course be extended in order to obtain satisfactory results in photoresist removal. This obviously shows the high process efficiency that can be realized by using the processing solution of the present invention.

What is claimed is:

1. A photoresist processing solution consisting essentially of:
   (a) a quaternary ammonium hydroxide of the formula I represented by the formula

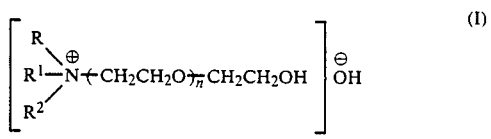

wherein
   R, R$^1$ and R$^2$ are the same and each is a methyl group; and
   n is a positive number of 1; and
   (b) a solvent in which compound (a) is dissolved in a concentration of from about 0.05 to 30 wt. %, such that said solution is suitable for developing or stripping a radiation-imaged photoresist coating, wherein said solvent is selected from the group consisting of water, a water-miscible organic solvent, and mixtures thereof.

2. The photoresist processing solution of claim 1 wherein said water-miscible organic solvent is selected from the group consisting of C$_1$ to C$_4$-aliphatic alcohols, acetone, methyl ethyl ketone, N-methylpyrrolidone, dimethyl sulfoxide, N,N-dimethylformamide, and N,N-dimethylacetamide.

3. The photoresist processing solution of claim 2, wherein the water-miscible organic solvent is acetone or N-methylpyrrolidone.

4. The photoresist processing solution of claim 1, wherein the solvent is water.

* * * * *